United States Patent
Lee et al.

(10) Patent No.: US 8,233,305 B2
(45) Date of Patent: Jul. 31, 2012

(54) MAGNETIC STRUCTURES, INFORMATION STORAGE DEVICES INCLUDING MAGNETIC STRUCTURES, METHODS OF MANUFACTURING AND METHODS OF OPERATING THE SAME

(75) Inventors: Sung-chul Lee, Osan-si (KR); Sun-ae Seo, Hwaseong-si (KR); Young-jin Cho, Suwon-si (KR); Ung-hwan Pi, Seoul (KR); Ji-young Bae, Seongnam-si (JP)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 404 days.

(21) Appl. No.: 12/458,249

(22) Filed: Jul. 7, 2009

(65) Prior Publication Data
US 2010/0172169 A1    Jul. 8, 2010

(30) Foreign Application Priority Data
Jan. 6, 2009    (KR) .................. 10-2009-0000824

(51) Int. Cl.
*G11C 19/00*    (2006.01)

(52) U.S. Cl. ............. 365/80; 365/29; 365/88; 365/97; 365/171

(58) Field of Classification Search .......... 365/80, 365/171, 88, 97, 32, 29
See application file for complete search history.

(56) References Cited

U.S. PATENT DOCUMENTS

| | | | |
|---|---|---|---|
| 6,222,702 B1 * | 4/2001 | Macken et al. | 360/128 |
| 6,834,005 B1 * | 12/2004 | Parkin | 365/80 |
| 7,859,881 B2 * | 12/2010 | Iwata et al. | 365/81 |
| 2007/0242505 A1 | 10/2007 | Ochiai et al. | |
| 2008/0080234 A1 | 4/2008 | Iwata et al. | |
| 2010/0208381 A1 * | 8/2010 | Kim et al. | 360/69 |
| 2010/0208506 A1 * | 8/2010 | Kim et al. | 365/80 |

FOREIGN PATENT DOCUMENTS

| | | |
|---|---|---|
| JP | 2007-073103 | 3/2007 |
| KR | 10-2007-0030741 | 3/2007 |
| KR | 10-0813270 | 3/2008 |
| KR | 10-2008-0041011 | 5/2008 |

\* cited by examiner

*Primary Examiner* — Pho M Luu
(74) *Attorney, Agent, or Firm* — Harness, Dickey & Pierce, P.L.C.

(57) ABSTRACT

A magnetic structure includes a first portion and a plurality of second portions. The first portion extends in a first direction. The plurality of second portions extend from ends of the first portion in a second direction. The first and second directions are perpendicular to one another. Two magnetic domains magnetized in directions opposite to each other and a magnetic domain wall between the magnetic domains are formed in the magnetic structure.

25 Claims, 8 Drawing Sheets

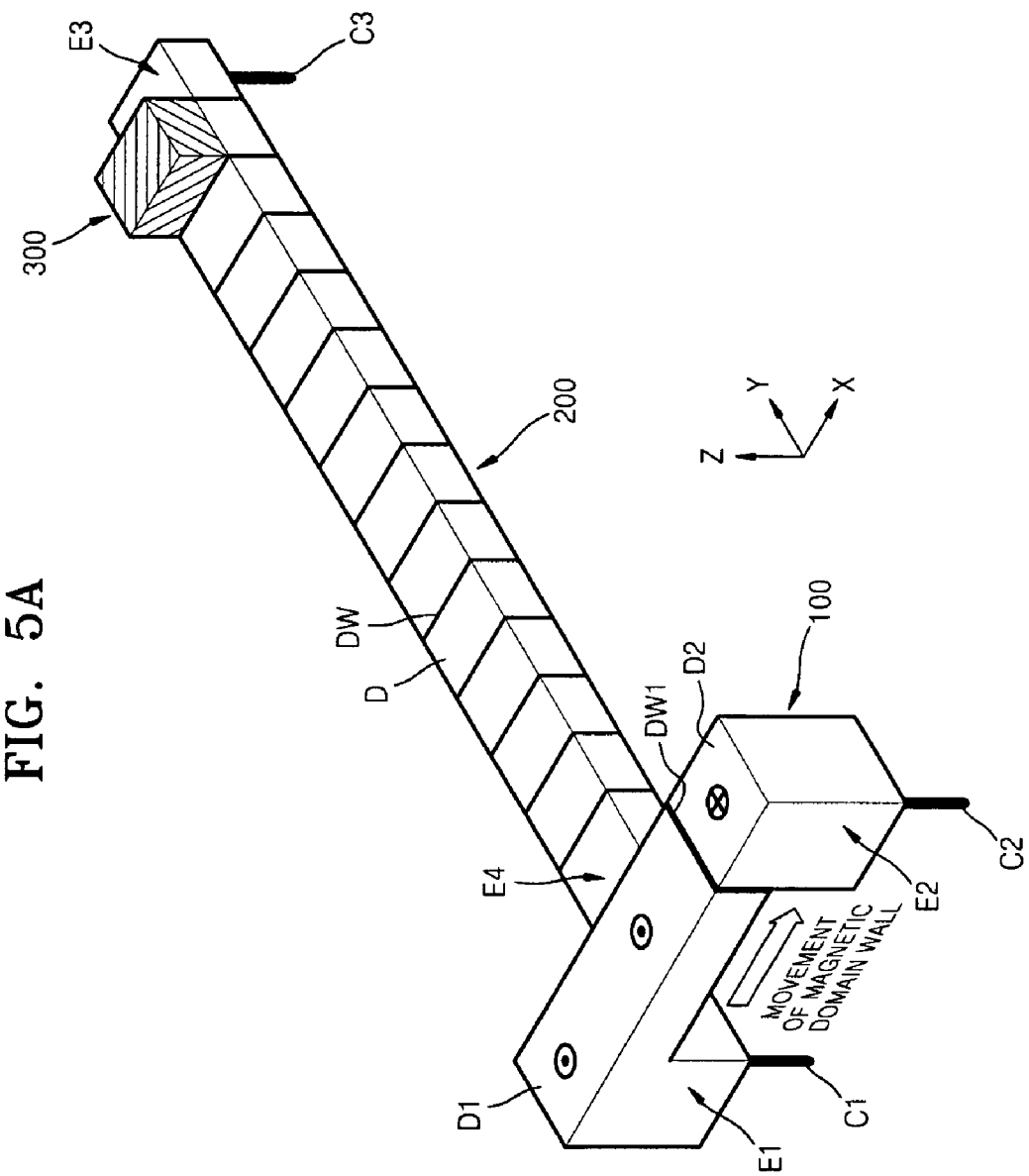

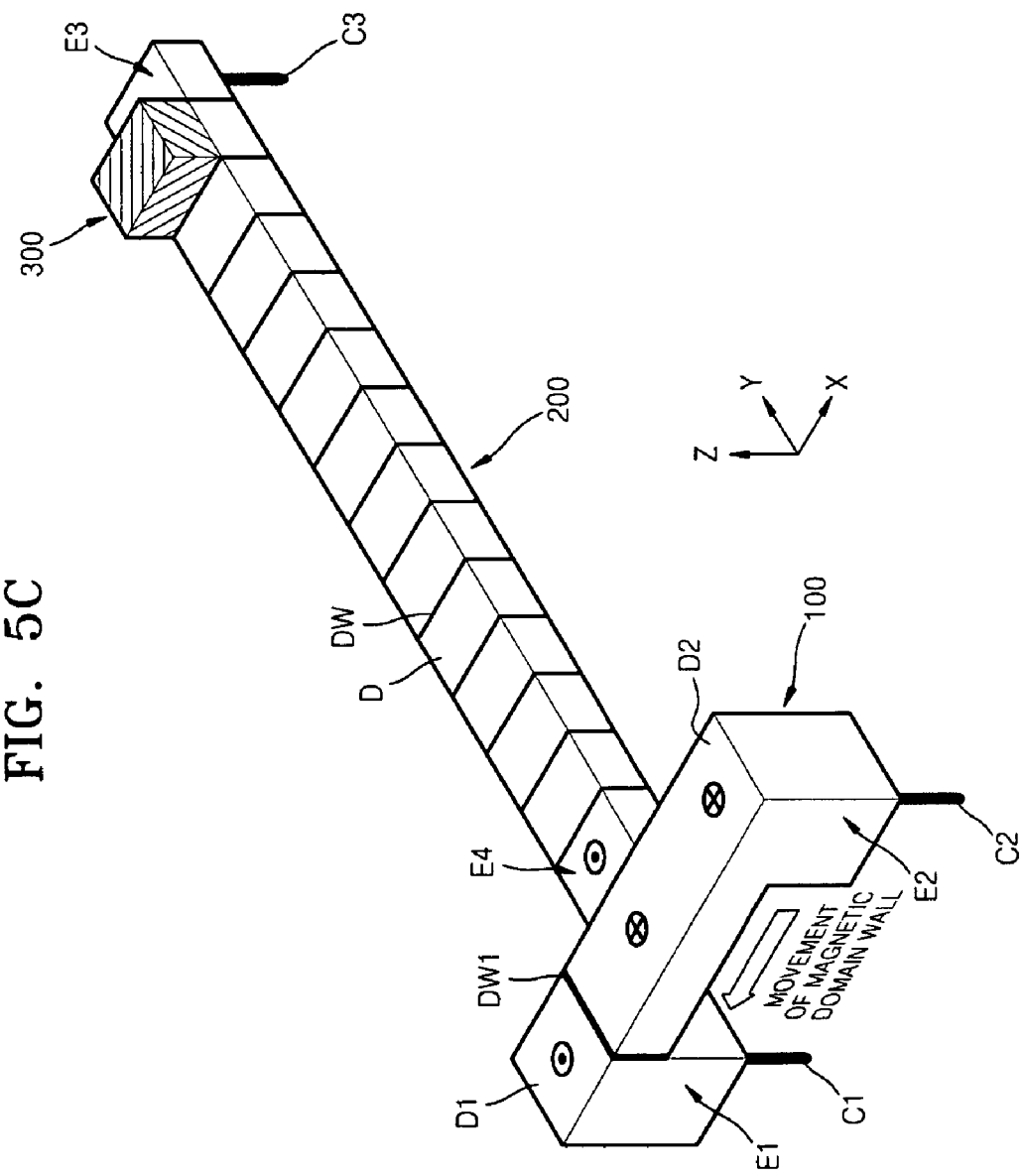

MAGNETIC STRUCTURES, INFORMATION STORAGE DEVICES INCLUDING MAGNETIC STRUCTURES, METHODS OF MANUFACTURING AND METHODS OF OPERATING THE SAME

CROSS-REFERENCE TO RELATED APPLICATION(S)

This non-provisional U.S. patent application claims priority under 35 U.S.C. §119 to Korean Patent Application No. 10-2009-0000824, filed on Jan. 6, 2009, in the Korean Intellectual Property Office, the entire contents of which is incorporated herein by reference.

BACKGROUND

1. Field

One or more example embodiments relate to magnetic structures, information storage devices including magnetic structures, methods of manufacturing and methods of operating the same.

2. Description of the Related Art

Related art non-volatile information storage devices include hard disk drives (HDDs), non-volatile random access memories (RAMs), etc. These types of storage devices retain recorded information even when power is cut off.

Related art HDDs have a rotating mechanical device. This rotating mechanical device may wear down and/or fail resulting in relatively low reliability.

A representative example of a related art non-volatile RAM is flash memory. Although a flash memory device does not use a rotating mechanical device, flash memory devices have lower reading and writing speeds, shorter lifetimes, and smaller storage capacity than HDDs. Also, flash memory devices have relatively high manufacturing costs.

Another type of information storage device uses movement of a magnetic domain wall of a magnetic material. A magnetic domain is a minute magnetic region in which magnetic moments are arranged in a specific direction within a ferromagnetic material. A magnetic domain wall is a border region between magnetic domains having different magnetization directions. A magnetic domain wall formed between magnetic domains may be moved by supplying a current to the magnetic material including the magnetic domains.

SUMMARY

Example embodiments relate to magnetic structures, information storage devices including magnetic structures, methods of manufacturing and methods of operating the same.

At least one example embodiment provides a magnetic structure for recording (writing) information (data). According to at least this example embodiment, the magnetic structure includes a first portion and a plurality of second portions. The first portion extends in a first direction. The first direction may be parallel to a substrate. Each of the plurality of second portions extends from an end of the first portion in a second direction, which is perpendicular to the first direction. Two magnetic domains magnetized in directions opposite to each other and a magnetic domain wall between the magnetic domains are formed in the magnetic structure.

The magnetic structure may have a U-shape or a reversed U-shape. The magnetic domain wall may be disposed in the first portion. The magnetic structure may have perpendicular magnetic anisotropy.

At least one other example embodiment provides a method of forming a magnetic structure. According to at least this example embodiment, a first portion extending in a first direction is prepared. The first direction may be parallel to a substrate. A plurality of second portions extending from ends of the first portion in a second direction perpendicular to the first direction are formed. A magnetic domain wall is formed in the magnetic structure by applying a magnetic field, parallel to the first direction, onto the magnetic structure. The magnetic structure may have a U-shape or a reversed U-shape. The magnetic structure may have perpendicular magnetic anisotropy.

At least one other example embodiment provides an information storage device using magnetic domain wall movement. According to at least this example embodiment, the information storage device includes a magnetic structure for recording information and at least one magnetic track for storing information connected to the magnetic structure. The magnetic structure includes a first portion and a plurality of second portions. The first portion extends in a first direction. The first direction may be parallel to a substrate. Each of the plurality of second portions extends from an end of the first portion in a second direction, which is perpendicular to the first direction. Two magnetic domains magnetized in directions opposite to each other and a magnetic domain wall between the magnetic domains are formed in the magnetic structure.

According to at least some example embodiments, the magnetic structure may have a U-shape or a reversed U-shape. The magnetic track may directly or indirectly contact the first portion of the magnetic structure.

The magnetic structure may be disposed at a first end of the magnetic track. In this example, the first end of the magnetic track contacts a side surface of the first portion of the magnetic structure. Also, the magnetic track may extend in a third direction, which is perpendicular to the magnetic structure (e.g., the first and second directions). The magnetic domain wall may be disposed in the first portion of the magnetic structure. The magnetic structure and the magnetic track may have perpendicular magnetic anisotropy. The information storage device may further include a read unit for reproducing (reading) information recorded in the magnetic track.

At least one other example embodiment provides a method of manufacturing an information storage device using magnetic domain wall movement. According to at least this example embodiment, a magnetic structure for recording information and at least one magnetic track for storing information are formed. The at least one magnetic track is connected to the magnetic structure. The magnetic structure may be formed as follows. A first portion extending in a first direction and a plurality of second portions extending from ends of the first portion in a second direction, which is perpendicular to the first direction, are formed. The first direction may be parallel to a substrate. A magnetic domain wall is formed in the magnetic structure by applying a magnetic field parallel to the first direction onto the magnetic structure.

According to at least some example embodiments, the magnetic structure may have a U-shape or a reversed U-shape. The magnetic track may directly or indirectly contact the first portion of the magnetic structure. Each of the magnetic structure and the magnetic track may be formed of a material having perpendicular magnetic anisotropy. The method may further include forming a read unit for reproducing information recorded in the magnetic track.

At least one other example embodiment provides a method of operating an information storage device including a magnetic structure and a magnetic track contacting the magnetic structure. According to at least this example embodiment, the magnetic structure includes a first portion and a plurality of second portions. The first portion extends in a first direction. The first direction may be parallel to a substrate. The plurality of second portions extend from ends of the first portion in a second direction, which is perpendicular to the first direction. Two magnetic domains magnetized in directions opposite to each other and a magnetic domain wall between the two magnetic domains are formed in the magnetic structure. According to at least this example embodiment, the magnetic domain wall is moved in the first direction such that the magnetic domain wall passes a region of the first portion, which contacts the magnetic track. A magnetic domain of the region of the first portion, which contacts the magnetic track, is then extended by at least one bit on the magnetic track.

According to at least some example embodiments, the magnetic domain wall may be moved in a direction opposite to the first direction so that the magnetic domain wall passes the region of the first portion, which contacts the magnetic track. In this example, a magnetic domain of the region of the first portion, which contacts the magnetic track, is extended by at least one bit on the magnetic track.

Example embodiments relate to magnetic structures, information storage devices including magnetic structures, methods of manufacturing and methods of operating the same. At least one example embodiment provides a magnetic structure usable in recording information in a magnetic track. The magnetic structure may include two magnetic domains separated by a magnetic domain wall. The two magnetic domains have opposite magnetization directions and each of the magnetic domains may include a first portion and a second portion. Within each magnetic domain, the first and second portions may have different thicknesses, but the same magnetization direction. The magnetic domain wall may move between the thicker second portions thereby extending one of the two magnetic domains to write data or information to a magnetic track.

BRIEF DESCRIPTION OF THE DRAWINGS

The general inventive concept will become apparent and more readily appreciated from the following description of the example embodiments, taken in conjunction with the accompanying drawings of which:

FIGS. 5A through 5D are perspective views for describing a method of operating an information storage device according to an example embodiment.

DETAILED DESCRIPTION

Figure 1:
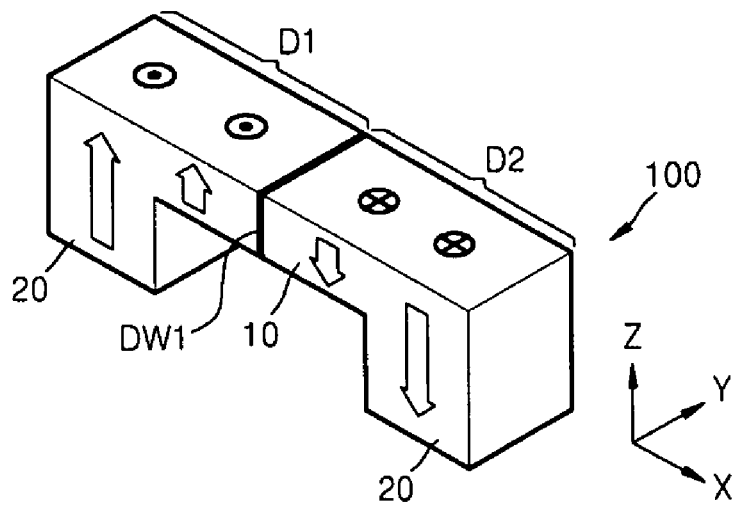
FIGS. 1 and 2 are perspective views of magnetic structures according to example embodiments.

Various example embodiments will now be described more fully with reference to the accompanying drawings in which some example embodiments are shown.

Detailed illustrative example embodiments are disclosed herein. However, specific structural and functional details disclosed herein are merely representative for purposes of describing example embodiments. This general inventive concept may, however, may be embodied in many alternate forms and should not be construed as limited to only the example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the general inventive concept. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items.

It will be understood that when an element or layer is referred to as being "formed on," another element or layer, it can be directly or indirectly formed on the other element or layer. That is, for example, intervening elements or layers may be present. In contrast, when an element or layer is referred to as being "directly formed on," to another element, there are no intervening elements or layers present. Other words used to describe the relationship between elements or layers should be interpreted in a like fashion (e.g., "between," versus "directly between," "adjacent," versus "directly adjacent," etc.).

The terminology used herein is for the purpose of describing particular embodiments only and is not intended to be limiting of example embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

In the drawings, the thicknesses of layers and regions are exaggerated for clarity. Like reference numerals in the drawings denote like elements.

FIG. 1 is a perspective view of a magnetic structure according to an example embodiment.

Referring to FIG. 1, the magnetic structure 100 includes a first portion 10 and a plurality of second portions 20. The first portion 10 extends in a given, desired or predetermined first direction. The first direction may be parallel to a substrate (not shown). In the example embodiment shown in FIG. 1, the first portion 10 extends in the X-axis direction. The plurality of second portions 20 extend from ends of the first portion 10 in a second direction, which is perpendicular or substantially perpendicular to the first direction. In FIG. 1, the plurality of second portions extend in the inverse Z-axis direction.

According to the example embodiment shown in, FIG. 1, the plurality of second portions 20 may be described as extending from two side surfaces of the first portion 10 in a length direction thereof (e.g., the X-axis direction). Alternatively, the plurality of second portions 20 may be described as extending from a top or bottom surface of the first portion 10.

As shown in FIG. 1, for example, the plurality of second portions 20 have a greater thickness than the first portion 10. In the following description, the plurality of second portions 20 are regarded as extending from the two side surfaces of the first portion 10 in the length direction thereof. In the magnetic structure 100, the relatively thin portion is regarded as the first portion 10 and the relatively thick portions at both sides of the first portion 10 are regarded as the plurality of second portions 20. As such, in this example embodiment the magnetic structure 100 has a reversed U-shape.

The first portion 10 and the plurality of second portions 20 may be formed of the same or substantially the same ferromagnetic material. For example, the first portion 10 and the plurality of second portions 20 may contain at least one element from the group including cobalt (Co), iron (Fe), and nickel (Ni), in addition to other material(s). The magnetic structure 100 may be a single, integral body. The magnetic structure 100 may have perpendicular magnetic anisotropy such that the first and second portions 10 and 20 have a magnetic easy axis that is parallel to, for example, the Z-axis.

Still referring to FIG. 1, the magnetic structure 100 may include first and second magnetic domains D1 and D2. The first and second magnetic domains D1 and D2 are magnetized in directions opposite to each other. The arrows shown on front surfaces of the first and second magnetic domains D1 and D2 indicate magnetization directions thereof. Marks shown on the top surfaces of the first and second magnetic domains D1 and D2 also indicate the magnetization directions corresponding to the arrows. These marks are also used in the other drawings with the same meaning. Although the first magnetic domain D1 is magnetized in the Z-axis direction and the second magnetic domain D2 is magnetized in the inverse Z-axis direction, the magnetization directions may be changed relative to each other.

Still referring to FIG. 1, a magnetic domain wall DW1 may be formed between the first and second magnetic domains D1 and D2. The magnetic domain wall DW1 may be located in a given, desired or predetermined region of the first portion 10. For example, the magnetic domain wall DW1 may be disposed at the center or midpoint of the first portion 10. The magnetic domain wall DW1 may be moved within the first portion 10 by supplying a current in a given, desired or predetermined direction to the magnetic structure 100. Because current and electrons move in opposite directions, the magnetic domain wall DW1 moves in the direction opposite to the direction of the applied current. The movement of the magnetic domain wall DW1 allows for variation in size of the first and second magnetic domains D1 and D2. As the magnetic domain wall DW1 moves, one of the first and second magnetic domains D1 and D2 becomes larger, while the other becomes smaller. According to at least some example embodiments, the magnetic domain wall DW1 moves between the plurality of second portions 20 within the first portion 10.

The form of the magnetic structure 100 may be variously changed. An example of such a variation is illustrated in FIG. 2.

Figure 2:
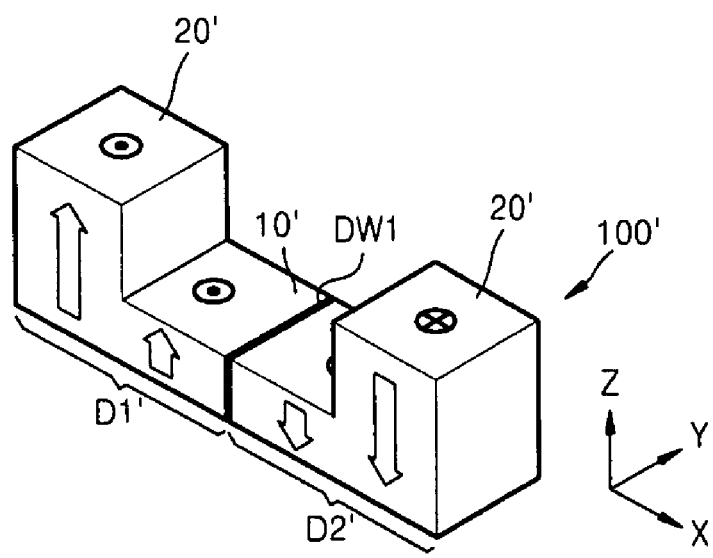

Referring to FIG. 2, in this example embodiment second portions 20' extend from two ends of a first portion 10' in the Z-axis direction. The magnetic structure 100' according to at least this example embodiment has a U-shape, but other shapes may also be suitable. In FIG. 2, reference numerals D1', D2', and DW1' represent a first magnetic domain, a second magnetic domain, and a magnetic domain wall, respectively. Magnetization directions of the first and second magnetic domain D1' and D2' are illustrated for example purposes, and the position of the magnetic domain wall DW1' may vary.

In FIGS. 1 and 2, the magnetic structures 100 and 100' are illustrated as symmetric structures, but magnetic structures according to example embodiments may be asymmetric structures. Also, bent portions or corners of the magnetic structures 100 and 100' are illustrated as having an angular shape. Alternatively, however, the bent portions of the magnetic structures may have a rounded or substantially rounded shape. In addition, structures of the magnetic structures 100 and 100' illustrated in FIGS. 1 and 2 may be variously changed.

Each of the magnetic structures 100 and 100' illustrated in FIGS. 1 and 2 may be used as a component of an information storage device using magnetic domain wall movement. In one example, each of the magnetic structures 100 and 100' may be used as a unit that records information (e.g., a write unit), which will be described in more detail later.

FIGS. 3A through 3D are cross-sectional views for describing a method of manufacturing a magnetic structure according to an example embodiment.

Figure 3A:
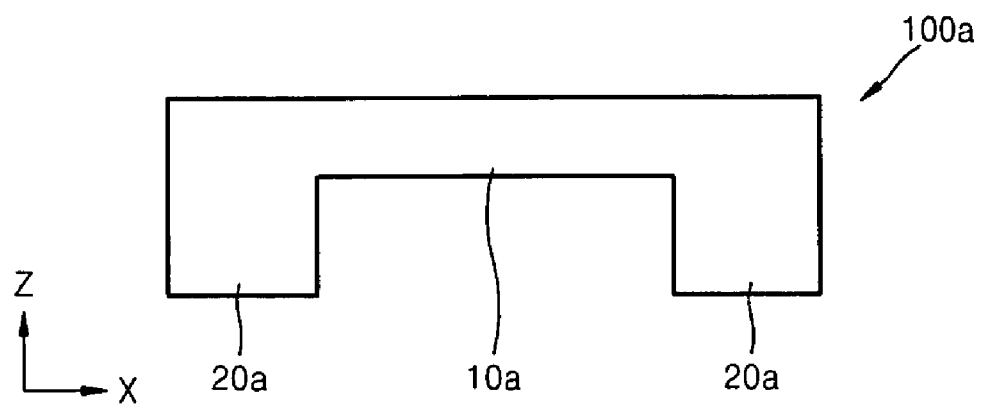
FIGS. 3A through 3D are cross-sectional views for describing a method of manufacturing a magnetic structure according to an example embodiment.

As shown in FIG. 3A, a magnetic structure 100a including a first portion 10a and a plurality of second portions 20a protruding (or extending) from two ends of the first portion 10a is prepared. In this example, the first portion 10a extends in the X-axis direction, which may be parallel to a substrate (not shown). The plurality of second portions 20a protrude in the inverse Z-axis direction perpendicular to the X-axis direction. The magnetic structure 100a may be formed by forming two grooves separated apart from each other in the substrate, depositing a magnetic layer on the substrate to fill the grooves, and patterning the magnetic layer. In this case, portions of the magnetic layer pattern filling the grooves serve as the plurality of second portions 20a. A remaining portion of the magnetic layer pattern between the plurality of second portions 20a serves as the first portion 10a.

Alternatively, the magnetic structure 100a may be formed by forming a reversed U-shape groove and filling the reversed U-shape groove with a magnetic material. In addition, the method of forming the magnetic structure 100a may be variously changed.

The first portion 10a and the plurality of second portions 20a may be formed of a ferromagnetic material containing at least one element selected from the group including Co, Fe, Ni, or the like. In addition to Co, Fe, and Ni, the ferromagnetic material may further include other material(s). The first portion 10a and the plurality of second portions 20a may have perpendicular magnetic anisotropy.

Figure 3B:
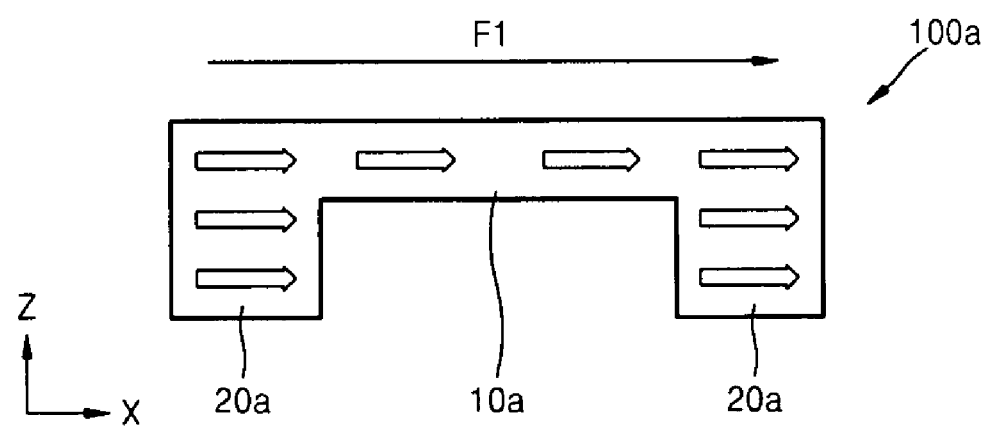

Referring to FIG. 3B, a magnetic field F1 having a direction parallel to the direction in which the first portion 10a extends (e.g., the X-axis direction) is applied to the magnetic structure 100a. In this case, the magnetic field F1 may have a strength sufficient to magnetize the first portion 10a and the plurality of second portions 20a in a horizontal direction. As a result, the first portion 10a and the plurality of second portions 20a may be magnetized in, for example, the X-axis direction.

Figure 3C:
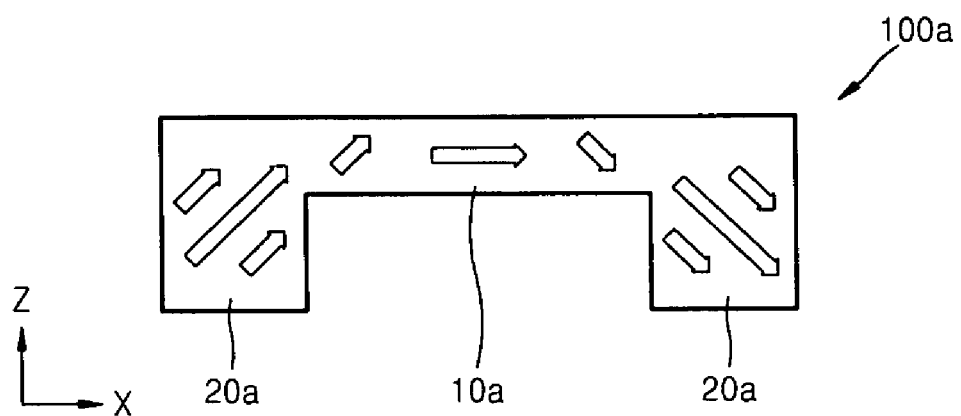

If the magnetic field F1 is removed, magnetization directions of the first portion 10a and the plurality of second portions 20a may change (e.g., gradually change) over time as illustrated in FIG. 3C. Eventually, the magnetization directions of the first and second portions 10a and 20a change completely as illustrated in FIG. 3D.

Referring to FIG. 3C, because the first portion 10a and the plurality of second portions 20a have perpendicular magnetic anisotropy (e.g., a magnetic easy axis parallel to the Z axis), the magnetization direction of the first portion 10a and the plurality of second portions 20a aligns with the Z axis or the inverse Z axis. Changes in the magnetization direction may occur more rapidly in the plurality of second portions 20a having a greater thickness than the first portion 10a. In this example embodiment, the magnetization direction rotates in a counter-clockwise direction in the left second portion 20a and a portion of the first portion 10a adjacent to the left second portion 20a, while the magnetization direction rotates in a clockwise direction in the right second portion 20a and a portion of the first portion 10a adjacent to the right second portion 20a. As a result, magnetostatic energy may be reduced and the magnetic structure 100a may become more energetically stable. Because the center of the magnetic structure 100a is magnetized in the X-axis direction, the magnetic structure 100a may become more energetically stable when a left portion thereof is magnetized in the counterclockwise direction and a right portion thereof is magnetized in the clockwise direction.

Figure 3D:
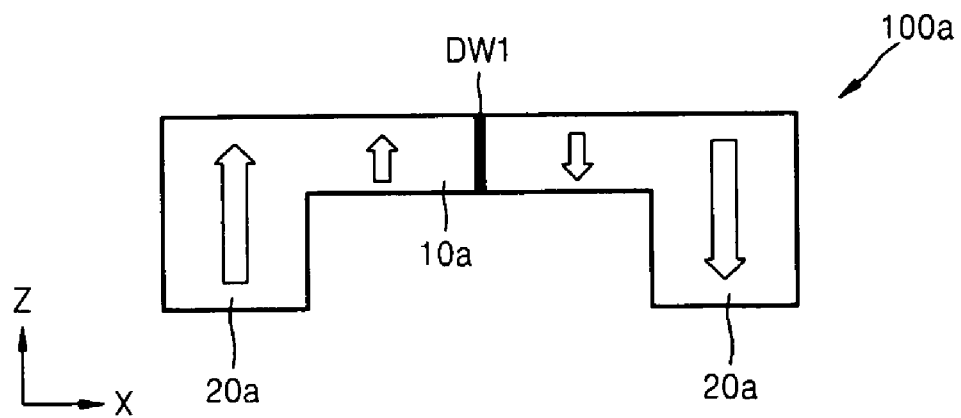

Thus, as illustrated in FIG. 3D, the left second portion 20a and the portion of the first portion 10a adjacent to the left second portion 20a may be magnetized in the Z-axis direction, whereas the right second portion 20a and the portion of the first portion 10a adjacent to the right second portion 20a may be magnetized in the inverse Z-axis direction. As a result of the differences in magnetization direction, a magnetic domain wall DW1 may be formed in the first portion 10a. The magnetic domain wall DW1 may be disposed, for example, at about the center or midpoint of the first portion 10a.

The magnetic structure 100a illustrated in FIG. 3D corresponds to the magnetic structure 100 illustrated in FIG. 1. But, the magnetic structure 100' illustrated in FIG. 2 may be formed using a method similar to the method illustrated in FIGS. 3A through 3D. For example, the magnetic structure 100' illustrated in FIG. 2 may be formed by forming a magnetic layer pattern having a uniform or substantially uniform thickness, etching a portion at a center of a top surface of the magnetic layer pattern to obtain a U-shape magnetic layer pattern, and applying a magnetic field to the U-shape magnetic layer pattern to generate a magnetic domain wall.

According to at least this example embodiment, the magnetic domain wall may be generated in a magnetic structure more simply using by applying an in-plane magnetic field rather than using an additional device for generating a magnetic domain wall.

Figure 4:
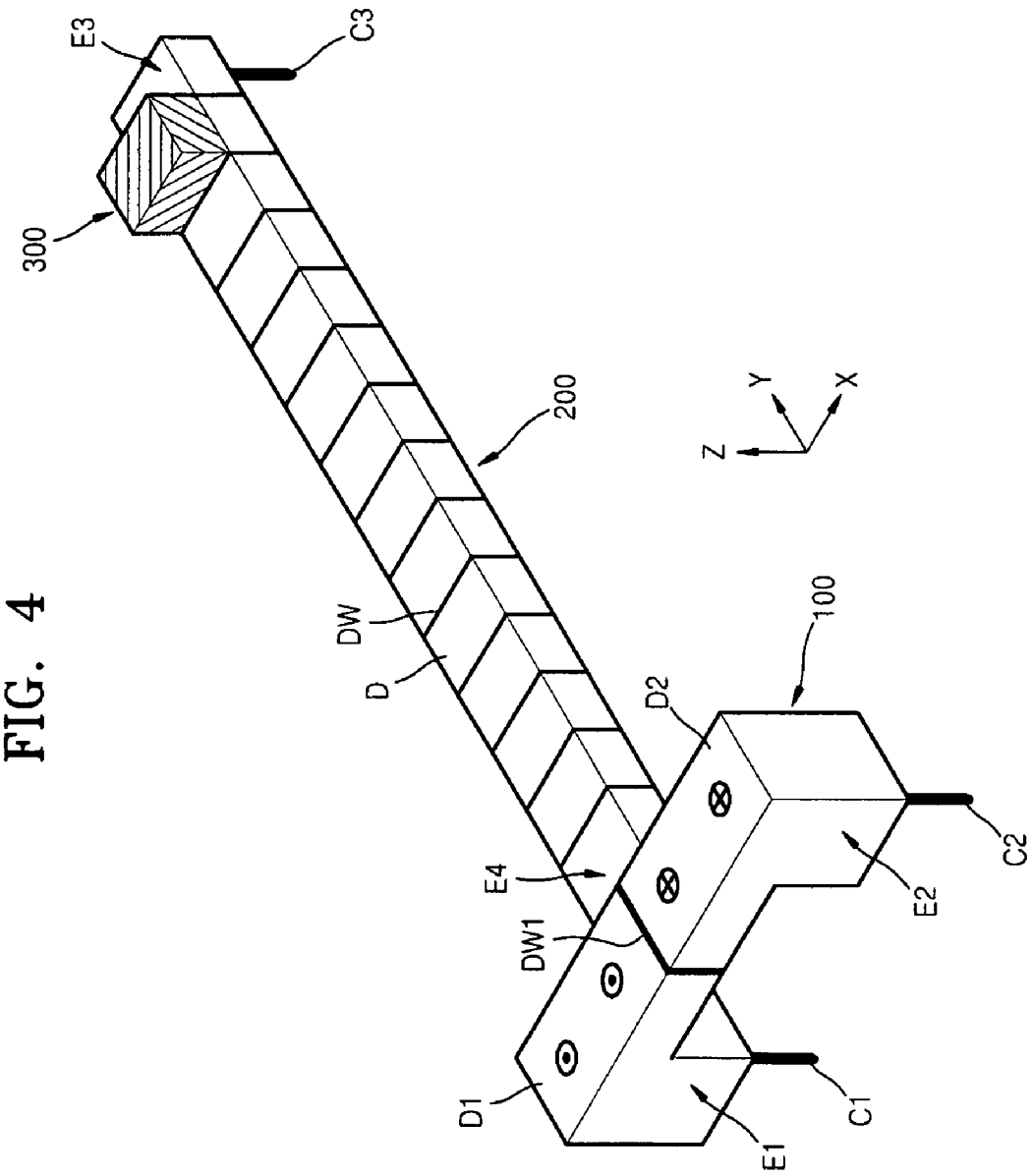
FIG. 4 is a perspective view of an information storage device according to an example embodiment.

FIG. 4 is a perspective view of an information storage device including a magnetic structure according to an example embodiment.

Referring to FIG. 4, according to at least one example embodiment the information storage device includes at least one magnetic track 200 connected to the magnetic structure 100. The magnetic track 200 may directly or indirectly contact a first portion 10 (see, e.g., FIG. 1) of the magnetic structure 100. For example, the magnetic track 200 may be arranged on a side surface of the first portion 10 of the magnetic structure 100. In this example, the magnetic track 200 extends in a direction perpendicular to the magnetic structure 100. The magnetic structure 100 may have the same or substantially the same structure as the magnetic structure 100 illustrated in FIG. 1 and may be substituted by the magnetic structure 100' illustrated in FIG. 2. The magnetic structure 100 may be used as an information write unit.

The magnetic track 200 may be an information storage track including a plurality of sequential magnetic domains D and a magnetic domain wall DW between adjacent magnetic domains D. Although a single magnetic track 200 is arranged on a side surface of the magnetic structure 100 in FIG. 4, the magnetic structure 100 may be formed to be longer, and thus a plurality of magnetic tracks 200 may be arranged on the side surface of the magnetic structure 100. The magnetic track 200 and at least a portion of the magnetic structure 100 may be formed of the same or substantially the same material by performing the same or substantially the same process at the same or substantially the same time (e.g., simultaneously or concurrently). The information storage device may include first and second wires C1 and C2. In one example, the first wire C1 is connected to a first end E1 of the magnetic structure 100, whereas the second wire C2 is connected to a second end E2 of the magnetic structure 100. A third wire C3 is connected to a first end E3 of the magnetic track 200, which is not adjacent to the magnetic structure 100, from among first and second ends E3 and E4 of the magnetic track 200.

The information storage device may further include a read unit 300 for reproducing information recorded in the magnetic track 200. The read unit 300 may be arranged, for example, on a magnetic domain D adjacent (e.g., immediately adjacent) to the first end E3 of the magnetic track 200. However, the position of the read unit 300 may be varied. The read unit 300 may be arranged on a top or bottom surface of a magnetic domain D. Alternatively, the read unit 300 may be divided and arranged on the top and bottom surfaces of a magnetic domain D, respectively. The read unit 300 may be a device using a tunnel magneto-resistance (TMR) effect (hereinafter referred to as a TMR device), a device using a giant magneto-resistance (GMR) effect (hereinafter referred to as a GMR device), or another device.

Although not shown in FIG. 4, the information storage device may further include a current detector connected to the read unit 300, and an information recording element connected between the current detector and the magnetic structure 100. The first and second wires C1 and C2 may be connected to the information recording element and the third wire C3 may also be connected to the information recording element.

The structure of the information storage device illustrated in FIG. 4 is merely an example and may be varied. For example, although the magnetic track 200 contacts the side surface of the magnetic structure 100 in FIG. 4, according to another example embodiment, the magnetic track 200 may be formed on a top surface of the magnetic structure 100. In this example, the magnetic track 200 and the magnetic structure 100 may contact each other indirectly by using a given, desired or predetermined connection layer there between. The connection layer may be arranged at the center of the top surface of the magnetic structure 100. The connection layer may be formed of a magnetic material having a lower magnetic anisotropic energy than the magnetic structure 100, or the same or substantially the same material as the magnetic structure 100. In addition, various changes may be made in the structure.

An example embodiment of a recording method of the information storage device illustrated in FIG. 4 will now be described in detail with reference to FIGS. 5A through 5D.

Referring to FIG. 5A, the magnetic domain wall DW1 may be moved in a direction from first end E1 to first end E2 of the magnetic structure 100 by supplying a current from the second end E2 to first end E1 of the magnetic structure 100. The supplied current from the second end E2 to first end E1 moves electrons from the first end E1 to the second end E2 of the magnetic structure 100. In this case, the magnetic domain wall DW1 passes the magnetic track 200 such that the first magnetic domain D1 extends to contact the magnetic track 200. In this example, the magnetic domain wall DW1 moves within the first portion (e.g., 10 in FIG. 1) in the X-direction from about the center or midpoint of the magnetic structure to a position about adjacent to a second portion (e.g., 20 in FIG. 1) of the magnetic structure 100.

The magnetic domain wall DW1 may be more difficult to move from a thinner portion (e.g., the first portion 10 illustrated in FIG. 1) to a thicker portion (e.g., either of the second portions 20 illustrated in FIG. 1) of the magnetic structure 100. This is because moving the magnetic domain wall DW1 from a thinner portion to a thicker portion represents a sudden increase in size of the magnetic domain wall DW1, which does not occur very easily. Thus, the magnetic domain wall DW1 may be moved within the thinner portion of the magnetic structure 100 (e.g., the first portion 10 illustrated in FIG. 1). In this case, the magnetic domain wall DW1 may not (or hardly) leave the magnetic structure 100. Using the magnetic structure 100 according to at least this example embodiment, information may be recorded more stably.

Figure 5B:
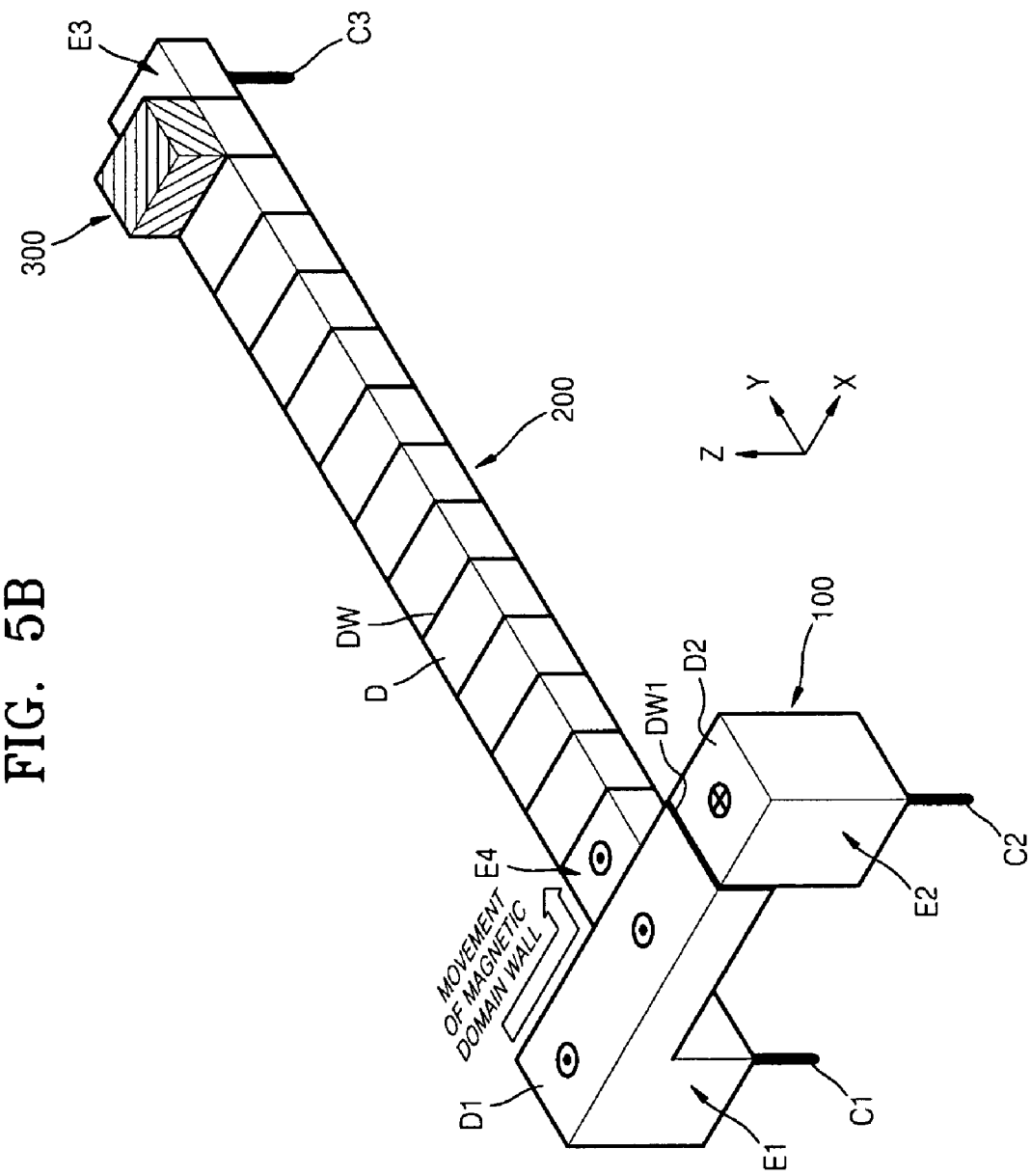

Referring to FIG. 5B, a magnetic domain of the magnetic structure 100, which contacts the magnetic track 200 (e.g., the first magnetic domain D1), may be moved (extended) to the second end E4 of the magnetic track 200 by supplying a pulse current from the first end E3 of the magnetic track 200 to the first end E1 of the magnetic structure 100. In this example, information corresponding to the first magnetic domain D1 (e.g., a value '1') is recorded in the second end E4 of the magnetic track 200. In this case, the information recorded in the second end E4 of the magnetic track 200 is referred to as first information.

Referring to FIG. 5C, the magnetic domain wall DW1 may be moved in a direction from the second end E2 to the first end E1 of the magnetic structure 100 by supplying a current from the first end E1 to the second end E2 of the magnetic structure 100. The supplied current moves electrons from the second end E2 to the first end E1 of the magnetic structure 100. In this example, the magnetic domain wall DW1 passes the magnetic track 200. As a result, the second magnetic domain D2 extends to contact the magnetic track 200.

As discussed above with regard to FIG. 5A, in this example the magnetic domain wall DW1 again moves within the first portion (e.g., 10 in FIG. 1) in the inverse X-direction from a position about adjacent to a second portion (e.g., 20 in FIG. 1) of the magnetic structure 100 to a position about adjacent to the other second portion (e.g., 20 in FIG. 1).

Figure 5D:
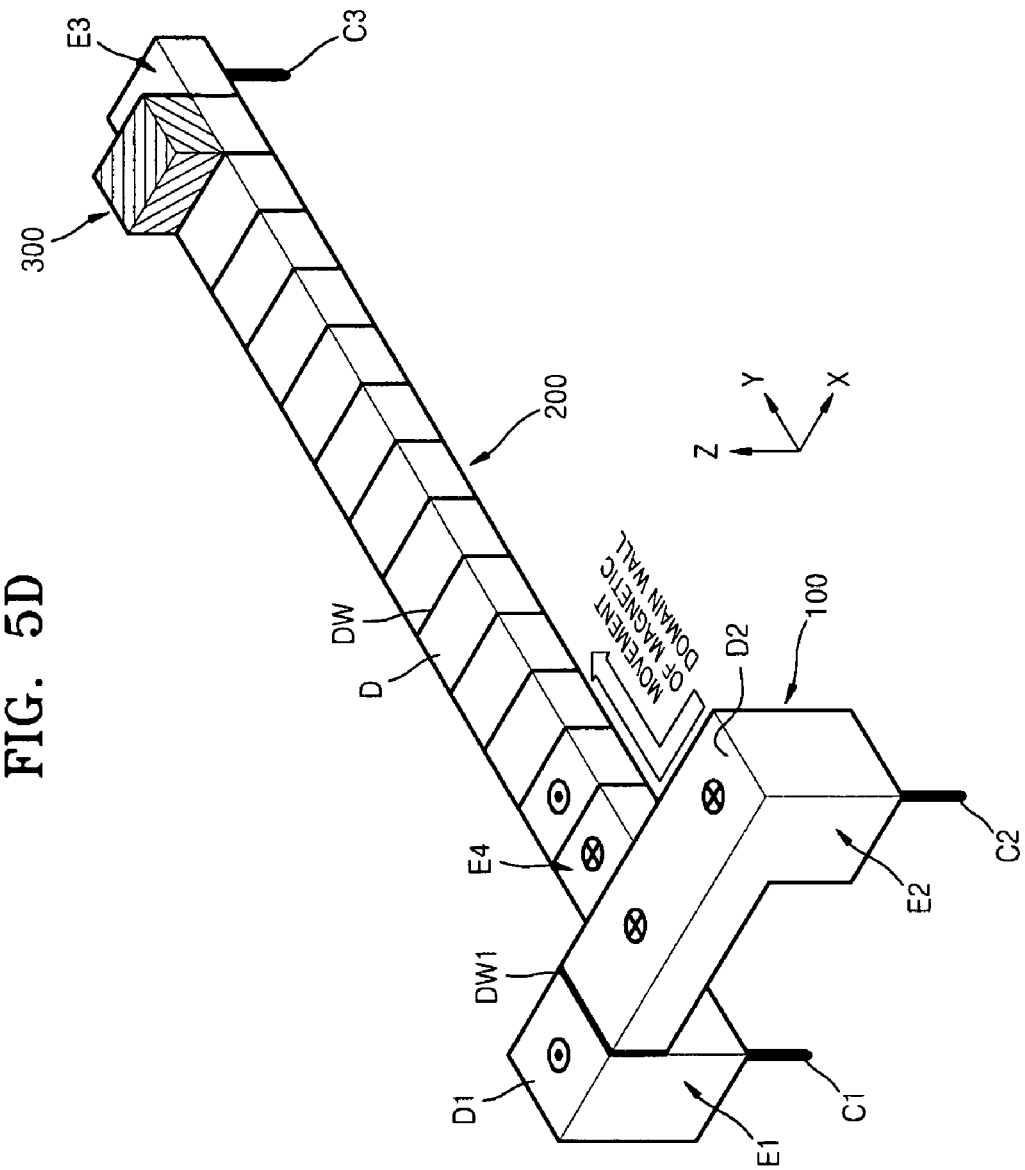

Referring to FIG. 5D, a magnetic domain of the magnetic structure 100, which contacts the magnetic track 200 (e.g., the second magnetic domain D2), may be moved (extended) to the second end E4 of the magnetic track 200 by supplying a pulse current from the first end E3 of the magnetic track 200 to the second end E2 of the magnetic structure 100. In this example, information corresponding to the second magnetic domain D2 (e.g., a value '0') is recorded in the second end E4 of the magnetic track 200. In this case, the first information that is recorded in FIG. 5B may be moved by one bit toward the first end E3 of the magnetic track 200.

As such, in an information storage device according to at least some example embodiments, information may be recorded more easily by appropriately moving magnetic domains and a magnetic domain wall within the magnetic structure 100 and in the magnetic track 200, which is connected to the magnetic structure 100.

A method of operating an information storage device illustrated in FIG. 4 according to an example embodiment will now be briefly described with reference to FIG. 4.

Information recorded in a magnetic domain D on which the read unit 300 is disposed, may be read (discriminated) by supplying a given, desired or predetermined reproduction or read current to the read unit 300. The resistance sensed in response to the reproduction current may change according to the type of information recorded in the magnetic domain D on which the read unit 300 is located. Thus, the information recorded in the magnetic domain D on which the read unit 300 is disposed may be read by detecting the resistance of the reproduction current. The information of the magnetic domain D on which the read unit 300 is disposed may be reproduced while moving the magnetic domain walls DW by one bit from the second end E4 to the first end E3 of the magnetic track 200. In addition, the information reproduced by the read unit 300 may be re-recorded in (e.g., transferred to) the second end E4 of the magnetic track 200.

If information reproduction, magnetic domain wall movement, and transfer of reproduced information are performed repeatedly, information recorded in the magnetic track 200 may eventually be the same or substantially the same as the original information before being reproduced when reproduction of information of the magnetic track 200 is complete. The transfer of the information may be performed by the information recording element (not shown) connected between the read unit 300 and the magnetic structure 100. In this case, the information recording element may be connected to the first end E3 of the magnetic track 200. However, the above-described reproduction method is merely an example and may be variously changed as the structure of the information storage device is changed.

A manufacturing method of an information storage device, according to an example embodiment, may include a method of forming a magnetic structure for recording information. For example, the magnetic structure 100 illustrated in FIG. 1 may be formed according to the method illustrated in FIGS. 3A through 3D. Alternatively, the magnetic structure 100' illustrated in FIG. 2 may be formed by modifying the method illustrated in FIGS. 3A through 3D.

Manufacturing methods of the information storage device according to example embodiments may also include forming at least one magnetic track for storing information, and forming a read unit on the magnetic track. In this example embodiment, at least one magnetic track is connected to the magnetic structure.

It should be understood that the example embodiments described therein should be considered in a descriptive sense only and not for purposes of limitation. For example, it will be understood by one of ordinary skill in the art that each of the magnetic structures 100 and 100' illustrated in FIGS. 1 and 2, respectively, may be used as a unit other than a write unit, that the structures illustrated in FIGS. 1, 2, and 4 may be variously changed, and that the methods illustrated in FIGS. 3A through 3D and 5A through 5D may also be variously changed. Thus, descriptions of features or aspects within each example embodiment should typically be considered as available for other similar features or aspects in other example embodiments.

What is claimed is:

1. A magnetic structure for recording information, the magnetic structure comprising:
   a first portion extending in a first direction; and
   a plurality of second portions, each of the plurality of second portions extending from an end of the first portion in a second direction perpendicular to the first direction; wherein
   two magnetic domains magnetized in directions opposite to each other are formed in the magnetic structure, the two magnetic domains being separated by a magnetic domain wall, and
   the magnetic structure is configured to record information to a storage element.

2. The magnetic structure of claim 1, wherein the magnetic structure has one of a U-shape and a reversed U-shape.

3. The magnetic structure of claim 1, wherein the magnetic domain wall is disposed in the first portion.

4. The magnetic structure of claim 1, wherein the magnetic structure has perpendicular magnetic anisotropy.

5. A method of forming a magnetic structure, the method comprising:
preparing the magnetic structure, the magnetic structure including,
a first portion extending in a first direction, and
a plurality of second portions extending from end portions of the first portion in a second direction perpendicular to the first direction; and
forming a magnetic domain wall in the magnetic structure by applying a magnetic field to the magnetic structure, the applied magnetic field being parallel to the first direction.

6. The method of claim 5, wherein the magnetic structure has one of a U-shape and a reversed U-shape.

7. The method of claim 5, wherein the magnetic structure has perpendicular magnetic anisotropy.

8. A method of manufacturing an information storage device, the method comprising:
forming a magnetic structure according to the method of claim 5; and
forming at least one magnetic track for storing information, the at least one magnetic track being connected to the magnetic structure.

9. The method of claim 8, wherein the magnetic structure has one of a U-shape and a reversed U-shape.

10. The method of claim 8, wherein the magnetic track directly or indirectly contacts the first portion of the magnetic structure.

11. The method of claim 8, wherein each of the magnetic structure and the magnetic track is formed of a material having a perpendicular magnetic anisotropy.

12. The method of claim 8, further comprising: forming a read unit configured to read information recorded in the magnetic track.

13. An information storage device comprising:
a magnetic structure having a first portion extending in a first direction, and a plurality of second portions, each of the plurality of second portions extending from an end of the first portion in a second direction perpendicular to the first direction, wherein
two magnetic domains magnetized in directions opposite to each other are formed in the magnetic structure, the two magnetic domains being separated by a magnetic domain wall; and
at least one magnetic track for storing information, the at least one magnetic track being connected to the magnetic structure.

14. The information storage device of claim 13, wherein the magnetic structure has one of a U-shape and a reversed U-shape.

15. The information storage device of claim 13, wherein the magnetic track directly or indirectly contacts the first portion of the magnetic structure.

16. The information storage device of claim 13, wherein the magnetic structure is disposed at an end of the magnetic track.

17. The information storage device of claim 16, wherein the end of the magnetic track contacts a side surface of the first portion of the magnetic structure.

18. The information storage device of claim 17, wherein the magnetic track extends in a direction perpendicular to the first and second directions.

19. The information storage device of claim 13, wherein the magnetic domain wall is disposed in the first portion of the magnetic structure.

20. The information storage device of claim 13, wherein the magnetic structure and the magnetic track have perpendicular magnetic anisotropy.

21. The information storage device of claim 13, further comprising: a read unit configured to read information recorded in the magnetic track.

22. A method of operating the information storage device of claim 13, the method comprising:
moving the magnetic domain wall in the first direction so that the magnetic domain wall passes a region of the first portion, which contacts the magnetic track; and
extending a magnetic domain of the region of the first portion, which contacts the magnetic track, by at least one bit on the magnetic track.

23. The method of claim 22, further comprising:
moving the magnetic domain wall in a direction opposite to the first direction so that the magnetic domain wall passes the region of the first portion, which contacts the magnetic track; and
extending a magnetic domain of the region of the first portion, which contacts the magnetic track, by at least one bit on the magnetic track.

24. The method of claim 22, wherein the magnetic structure has one of a U-shape and a reversed U-shape.

25. The method of claim 22, wherein the magnetic structure and the magnetic track have perpendicular magnetic anisotropy.

* * * * *